(12) United States Patent
Oliver et al.

(10) Patent No.: US 7,710,667 B2
(45) Date of Patent: May 4, 2010

(54) IMAGING MODULE WITH SYMMETRICAL LENS SYSTEM AND METHOD OF MANUFACTURE

(75) Inventors: Steve Oliver, San Jose, CA (US); Rick Lake, Meridian, ID (US); Shashikant Hegde, Boise, ID (US); Jeff Viens, Boise, ID (US); Jacques Duparre, Jena (DE)

(73) Assignee: Aptina Imaging Corp., George Town, Grand Cayman (KY)

( * ) Notice: Subject to any disclaimer, the term of this patent is extended or adjusted under 35 U.S.C. 154(b) by 77 days.

(21) Appl. No.: 12/146,306

(22) Filed: Jun. 25, 2008

(65) Prior Publication Data

US 2009/0323206 A1 Dec. 31, 2009

(51) Int. Cl.
*G02B 9/36* (2006.01)
*G02B 9/08* (2006.01)
*G02B 3/02* (2006.01)
*G02B 9/00* (2006.01)

(52) U.S. Cl. ............... 359/776; 359/775; 359/740; 359/715; 359/796

(58) Field of Classification Search ............. 359/708, 359/715, 738–740, 771, 772, 775, 776, 796, 359/797
See application file for complete search history.

(56) References Cited

U.S. PATENT DOCUMENTS

| | | | |
|---|---|---|---|
| 5,000,552 A | 3/1991 | Simpson, Jr. et al. | |
| 5,691,548 A | 11/1997 | Akio | |
| 6,049,430 A | 4/2000 | Heanue et al. | |
| 6,457,645 B1 | 10/2002 | Gardner, Jr. | |
| 6,679,964 B2 | 1/2004 | Lee et al. | |
| 6,813,099 B2 * | 11/2004 | Yamaguchi | 359/779 |
| 6,940,891 B2 | 9/2005 | Clary et al. | |
| 6,995,901 B2 | 2/2006 | Heffelfinger | |
| 7,173,774 B2 | 2/2007 | Ning | |
| 7,208,771 B2 | 4/2007 | Kathman et al. | |
| 7,342,731 B2 * | 3/2008 | Lee et al. | 359/772 |
| 2003/0190803 A1 | 10/2003 | Harchanko et al. | |
| 2005/0231626 A1 | 10/2005 | Tuttle et al. | |

(Continued)

FOREIGN PATENT DOCUMENTS

CA 502896 5/1954

(Continued)

OTHER PUBLICATIONS

R. Volkel, et al., "Miniaturization of Imaging Systems," MST/MEMS for production engineering, mstnews Feb. 2003, pp. 36-38, http://www.suss-microoptics.com/downloads/Publications/Miniaturization_of_Imaging_Systems.pdf.

(Continued)

*Primary Examiner*—Jack Dinh
(74) *Attorney, Agent, or Firm*—Dickstein Shapiro LLP

(57) ABSTRACT

An imaging module and method of fabrication. The method comprises forming a first lens wafer with a plurality of outer negative lenses and forming a second lens wafer with a plurality of inner negative lenses The method further comprises bonding the first lens wafer and second lens wafer to create a bonded stack; forming a plurality of inner positive lenses on the second lens wafer and bonding a spacer wafer to the second lens wafer; and forming a plurality of outer positive lenses on the first lens wafer.

15 Claims, 20 Drawing Sheets

U.S. PATENT DOCUMENTS

| | | |
|---|---|---|
| 2005/0249487 A1 | 11/2005 | Gutierrez |
| 2005/0254133 A1 | 11/2005 | Akram et al. |
| 2005/0275750 A1 | 12/2005 | Akram et al. |
| 2007/0029277 A1 | 2/2007 | Jacobowitz et al. |
| 2007/0200132 A1 | 8/2007 | Kathman et al. |
| 2007/0241265 A1 | 10/2007 | Yafuso |
| 2007/0255098 A1 | 11/2007 | Wang et al. |
| 2007/0258711 A1 | 11/2007 | Mihara et al. |
| 2007/0275505 A1 | 11/2007 | Wolterink et al. |
| 2008/0118241 A1 | 5/2008 | TeKolste et al. |

FOREIGN PATENT DOCUMENTS

| | | |
|---|---|---|
| EP | 0 309 948 A2 | 4/1989 |
| EP | 0 467 240 A1 | 1/1992 |
| EP | 0 948 055 A2 | 10/1999 |
| EP | 1 389 804 A2 | 2/2004 |
| EP | 1 772 908 A2 | 4/2007 |
| GB | 791311 | 2/1958 |
| GB | 1 269 133 | 4/1972 |
| JP | 2007-097192 | 4/2007 |

OTHER PUBLICATIONS

Jose Sasian, "From the landscape lens to the planar lens: a reflection on teaching lens design," College of Optical Sciences, University of Arizona, http://www.optics.arizona.edu/sasian/opt517/Word_Docs/classical%20lenses.pdf.

* cited by examiner

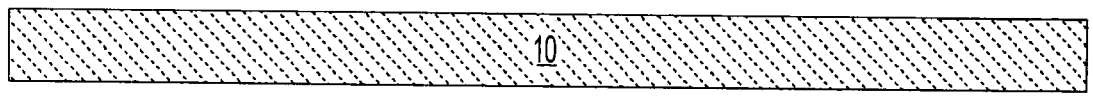
FIG. 3A
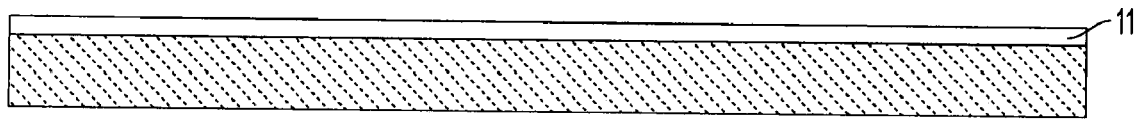
FIG. 3B
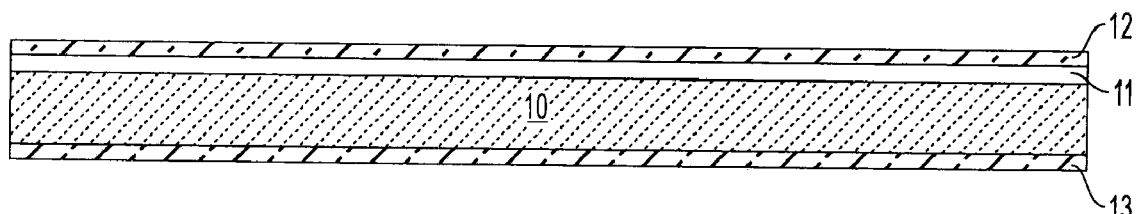
FIG. 3C
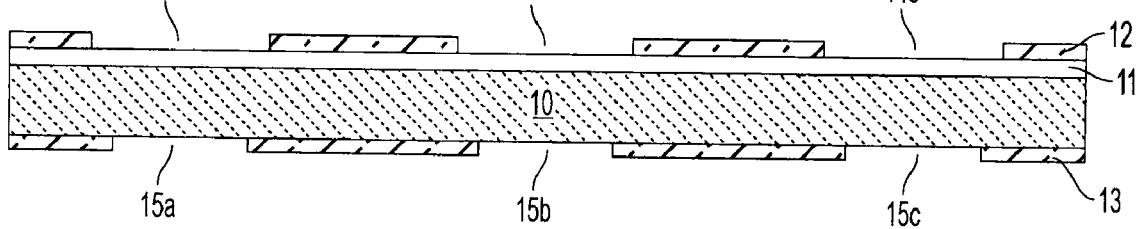
FIG. 3D

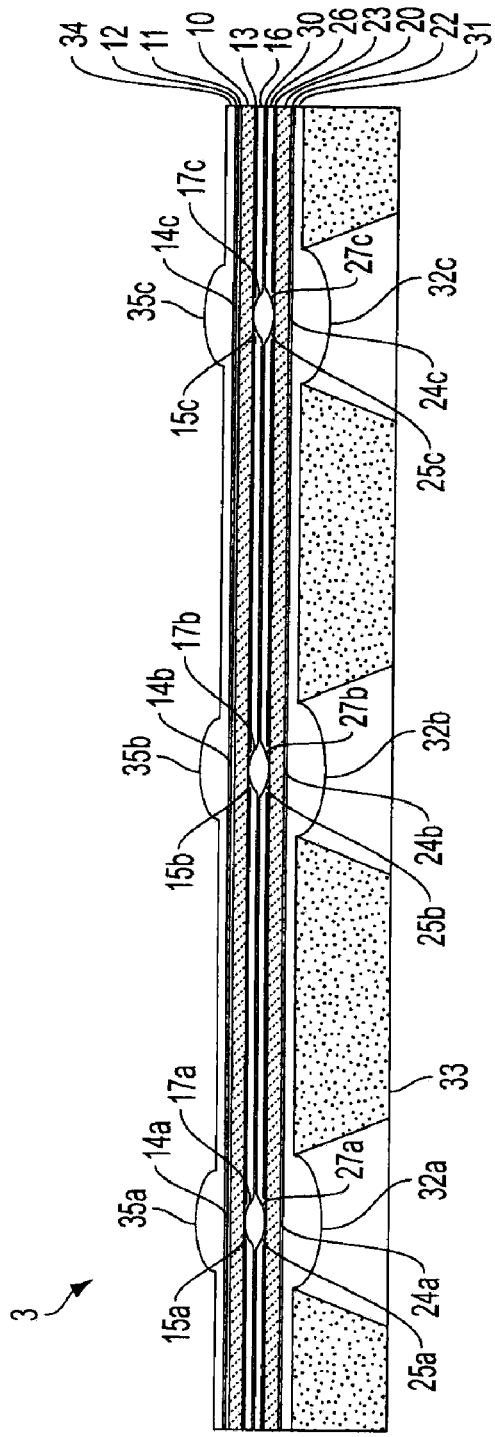
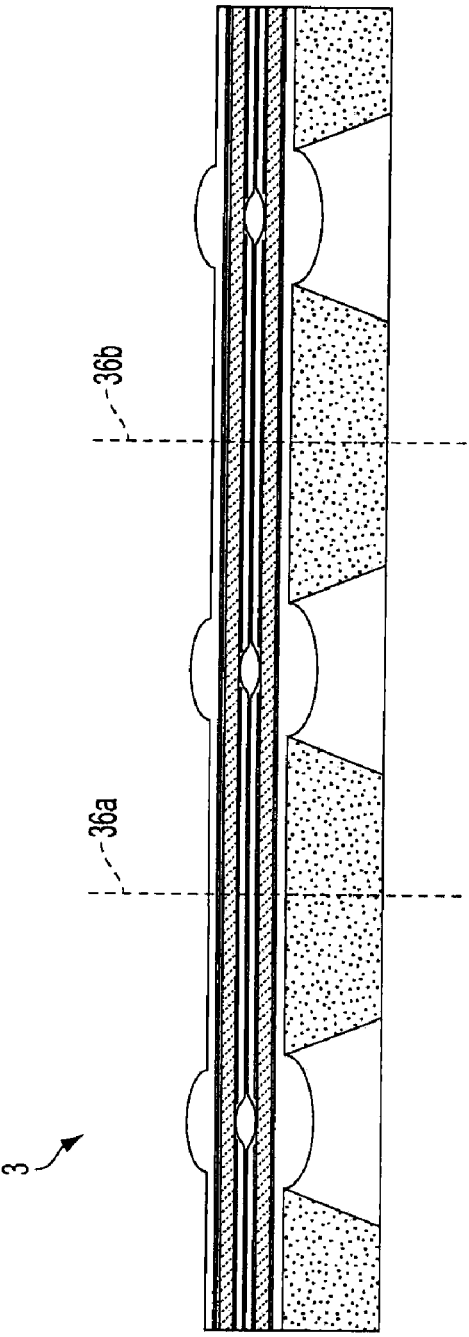

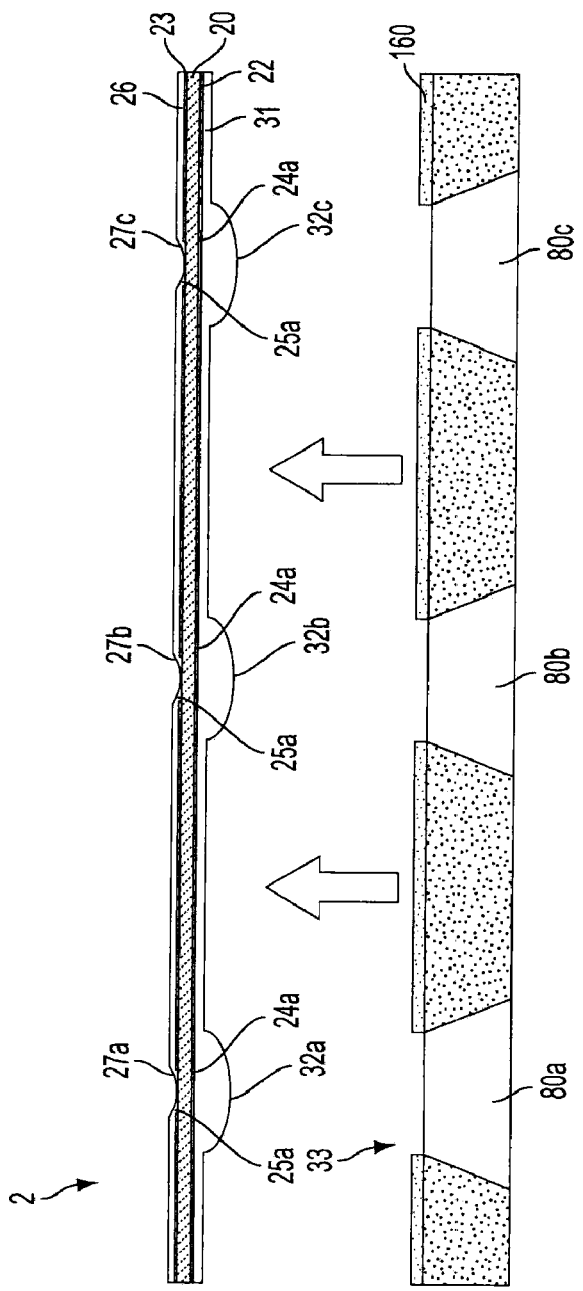
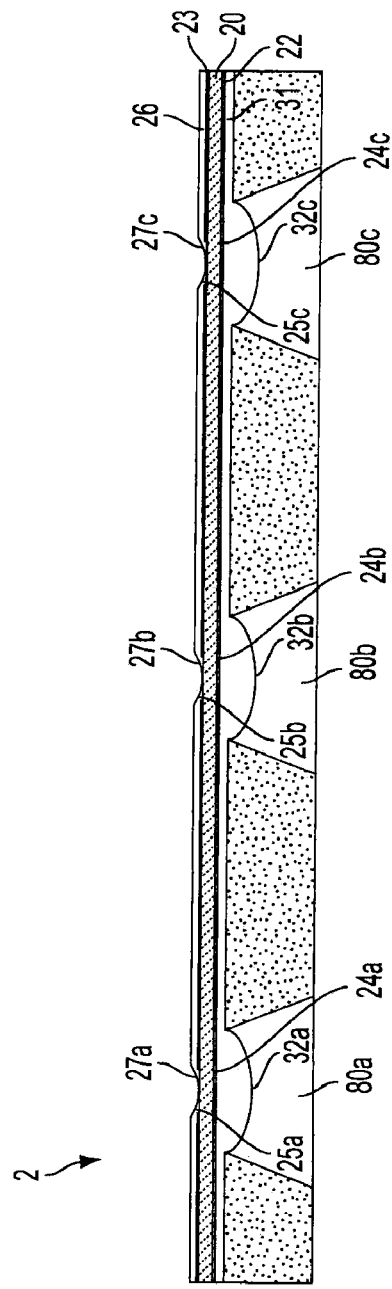
FIG. 16
FIG. 17

IMAGING MODULE WITH SYMMETRICAL LENS SYSTEM AND METHOD OF MANUFACTURE

FIELD OF THE INVENTION

Embodiments of the invention are directed to imaging module apparatuses and methods of manufacturing the same.

BACKGROUND OF THE INVENTION

Conventional cameras use lens systems comprised of substantially spherical lenses. General design principles are applied to reduce aberrations and to achieve a desired image quality. When less aberration is desired, more lens elements are added. Examples of general structural design principles used in conventional camera lenses include symmetry around the system aperture, combining large diameter lenses with small diameter lenses, combining low dispersion (Abbe number >50) and high dispersion lenses (Abbe number <50), use of substantially spherical lenses, use of thin substrates to bend the lenses and use of artificial vignetting.

Lenses used in wireless telephones (e.g., cellular telephones) present a unique challenge because they must be compact, inexpensive, used with a digital pixel array and provide a high-quality picture. To achieve these goals, designers have used wafer-level optics (WLO), which involves packaging small lenses with the digital circuitry, including a pixel array. Currently, however, lenses used in wafer-level optics are highly aspheric, or "free form," often with aspheric coefficients of the 10th to 14th order, unlike lenses used in more traditional cameras.

FIG. 1 shows an example of a packaged lens system 101 used in a cell phone camera. Lens system 101 has an outer lens substrate 102 and an inner lens substrate 103, wherein inner lens substrate 103 is between outer lens substrate 102 and the image plane on a pixel array. Outer lens substrate 102 has one positive lens 107, and inner lens substrate 103 has two highly aspheric, or "free form" lenses 105, 106 separated by substrate 104. Outer lens substrate 102 may have a second lens as well. Lens system 101 includes a spacer 108 that is connected to inner lens substrate 103 and outer lens substrate 102 and fixes the lenses in the position shown in FIG. 1.

In current wafer-level lens designs such as the illustrated lens system 101, there is a lack of symmetry and thus strong ray bending (e.g., ray bundle W) to achieve a short total track of the imaging systems with a comparatively large focal length and small chief ray angle (CRA). Aberrations introduced by these strict specifications are reduced by introducing free form lenses 105, 106 with high aspheric coefficients. These free form lenses actually cause an increase in aberrations if, by the influence of fabrication tolerances, the ray bundles do not follow their expected path through the lenses. To reduce size, lens system 101 requires lens 106 be separated from the image plane by distance d, which also requires that lens 106 have a larger diameter than would be required if lens 106 were farther from the image plane. Moreover, fabrication of free form structures can be complicated.

Accordingly, a new fabrication method for lens systems and wafer-level lens systems is desired.

BRIEF DESCRIPTION OF THE DRAWINGS

FIG. 3A is a cross-sectional view depicting a transparent substrate for an imaging module at an initial stage of processing.

FIG. 3B is a cross-sectional view at a stage of processing subsequent to that shown in FIG. 3A.

FIG. 3C is a cross-sectional view at a stage of processing subsequent to that shown in FIG. 3B.

FIG. 3D is a cross-sectional view at a stage of processing subsequent to that shown in FIG. 3C.

FIG. 10 is a cross-sectional view at a stage of processing subsequent to that shown in FIG. 9.

FIG. 11 is a cross-sectional view at a stage of processing subsequent to that shown in FIG. 10.

FIG. 16 is a cross-sectional view depicting wafers for an imaging module at an intermediate stage of processing.

FIG. 17 is a cross-sectional view at a stage of processing subsequent to that shown in FIG. 16.

DETAILED DESCRIPTION OF THE INVENTION

Figure 1A:
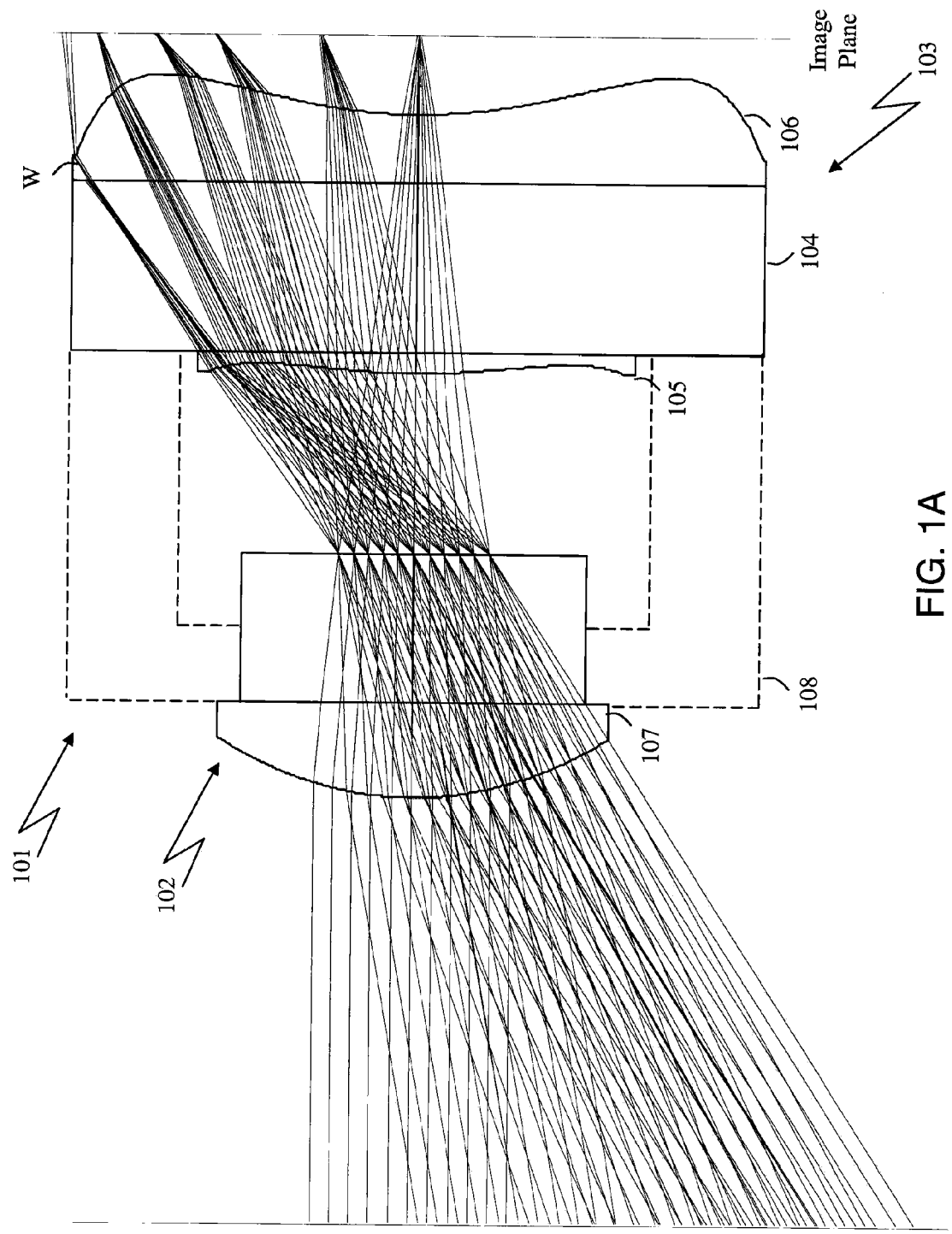
FIG. 1A is a cross-sectional view of a prior art lens apparatus.

In the following detailed description, reference is made to various embodiments that are described with sufficient detail to enable those skilled in the art to practice them. It is to be understood that other embodiments may be employed, and that various structural or logical changes may be made without departing from the spirit or scope of the invention.

General design principles used in conventional cameras are currently neglected in cell phone cameras. The application of these rules, however, requires maximizing system symmetry, meaning that the maximum chief ray angle (CRA) on the image sensor is sufficiently equal to the corresponding maximum field of view angle.

A lens system that meets the above criteria is described in U.S. patent application Ser. No. 12/216,244, filed Jul. 1, 2008, and entitled Lens System with Symmetrical Optics, which is assigned to Micron Technology, Inc, incorporated herein by reference and is shown in FIG. 1B. The lens system 120 comprises two lens structures 121, 128. The outer lens structure 121 comprises large diameter positive lens 122 and small diameter negative lens 124, separated by transparent substrate 123 on which lenses 122, 124 are affixed. The inner lens structure 128 comprises large diameter positive lens 127 and small diameter negative lens 125, separated by transparent substrate 126 on which lenses 125, 127 are affixed. This lens system, however, does not define the structural support and electrical connections surrounding the lens system or a process for manufacturing the lens system.

Various embodiments described herein relate to imaging modules and methods for their manufacture. In desired embodiments, wafer-level imaging modules are described which include the lens system shown in FIG. 1B, described in U.S. patent application Ser. No. 12/216,244, filed Jul. 1, 2008. Embodiments described herein also provide a method for making the FIG. 1B lens system structured at a wafer-level, and method of making other wafer-level lens systems. It should be understood that the drawings contained herein are not to scale and parts of the apparatuses shown are enlarged or reduced for clarity.

Figure 2A:
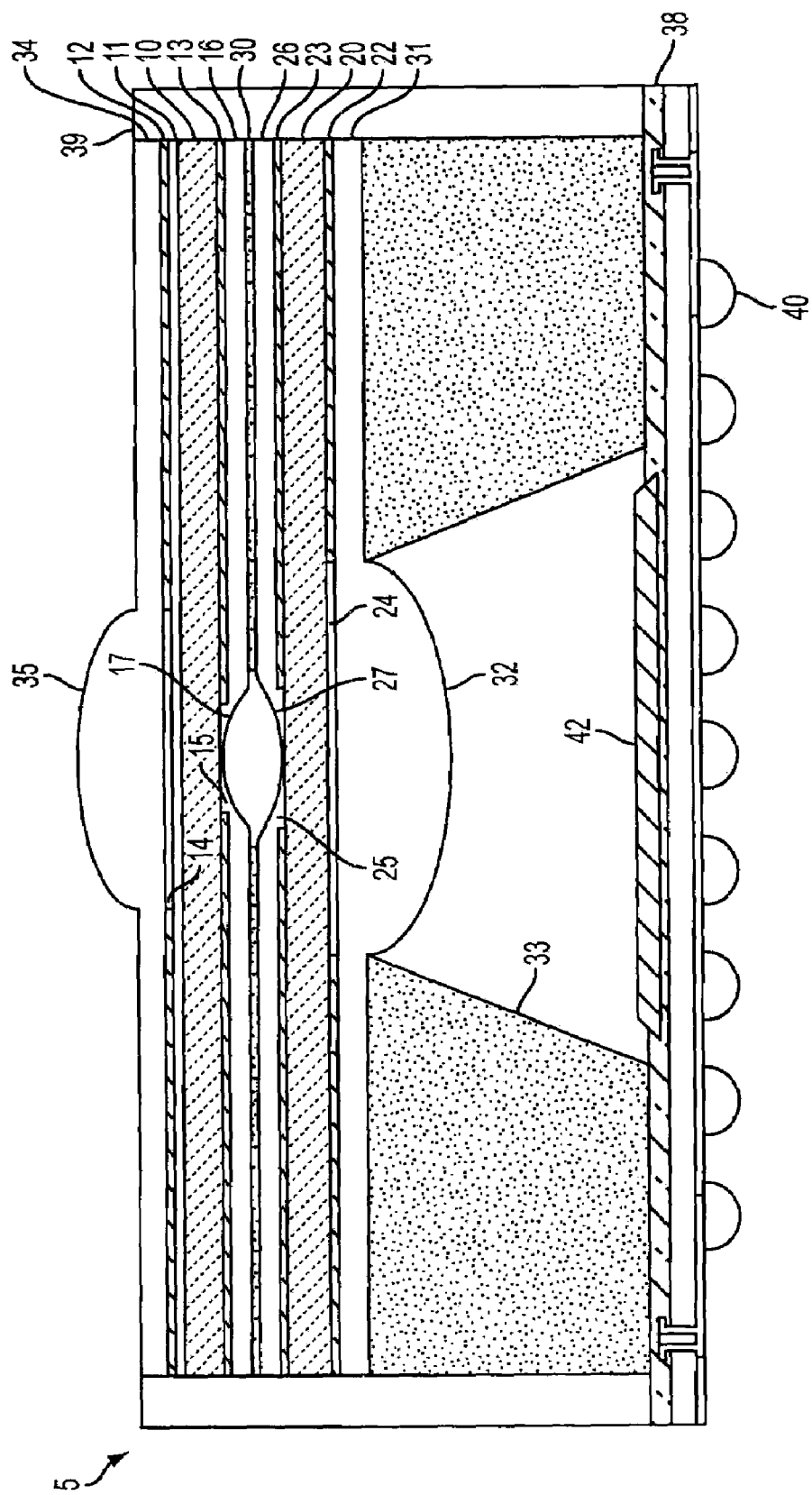
FIG. 2A is a cross-sectional view of an imaging module described herein.
Figure 2B:
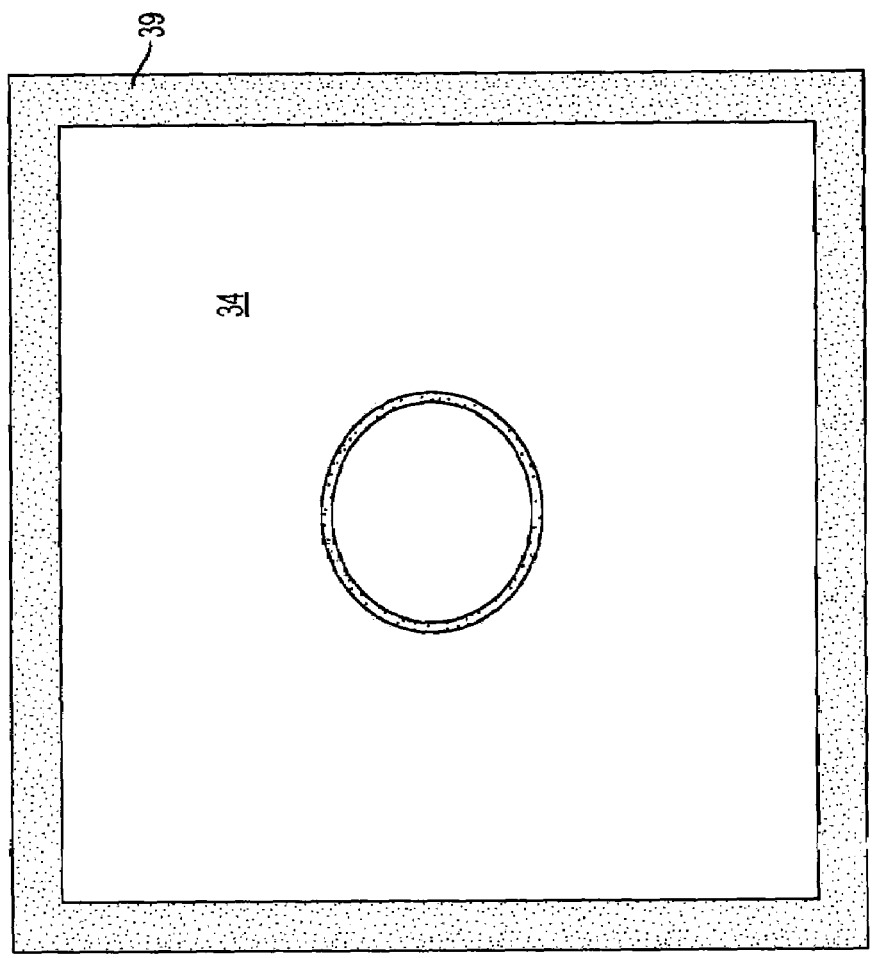
FIG. 2B is a top-down view of the imaging module of FIG. 2A.

Now referring to the figures, where like reference numbers designate like elements, FIGS. 2A and 2B show cross-sectional and top-down views, respectively, of an embodiment of an imaging module 5. Referring to FIG. 2A, outer positive lens 35 is separated from outer negative lens 17 by transparent substrate 10. A second transparent substrate 20 separates inner negative lens 27 from inner positive lens 32. A spacer wafer 33 separates inner positive lens 32 from a through-wafer interconnect (TWI) wafer 38 having an image sensor 42 in the image plane. It is to be understood that, although through-wafer interconnect wafers are shown in the embodiments described herein, wire-bonded wafers may also be used. As shown in both FIGS. 2A and 2B, encapsulating material 39 surrounds the imaging module 5 on all sides.

Good optical symmetry is attained by the use of outer positive lens 35, outer negative lens 17, inner negative lens 27 and inner positive lens 32 which are essentially spherical or at worst having low order aspheric coefficients (e.g., 6th order coefficients). An air gap exists between the negative lenses 17, 27. All lenses 17, 27, 32, 35 comprise a low dispersion (Abbe number >50) material. In an alternative embodiment, the positive lenses 32, 35 may each comprise a low dispersion (Abbe number >50) material and the negative lenses 17, 27 each comprise a high dispersion (Abbe number <50) material. In yet another alternative embodiment, the positive lenses 32, 35 each comprise a high dispersion (Abbe number <50) material and the negative lenses 17, 27 each comprise a low dispersion (Abbe number >50) material.

As shown in FIG. 2A, imaging module 5 has four aperture layers 12, 13, 23, 22 containing apertures 14, 15, 25, 24, respectively. Aperture 15 is the system stop and apertures 14, 24, 25 are field stops.

The transparent substrates 10, 20 can be any thickness that allows the entrance pupil to be sufficiently close to the system stop 15 so that the system stop 15 is far enough from the other apertures 14, 24, 25, to allow the apertures 14, 24, 25 to work as field stops for vignetting, artificial light suppression and reducing spurious light and lens flare. An example of relative diameters of the apertures would be, listed from largest to smallest: aperture 24, aperture 14, aperture 25, and aperture 15.

Figure 2C:
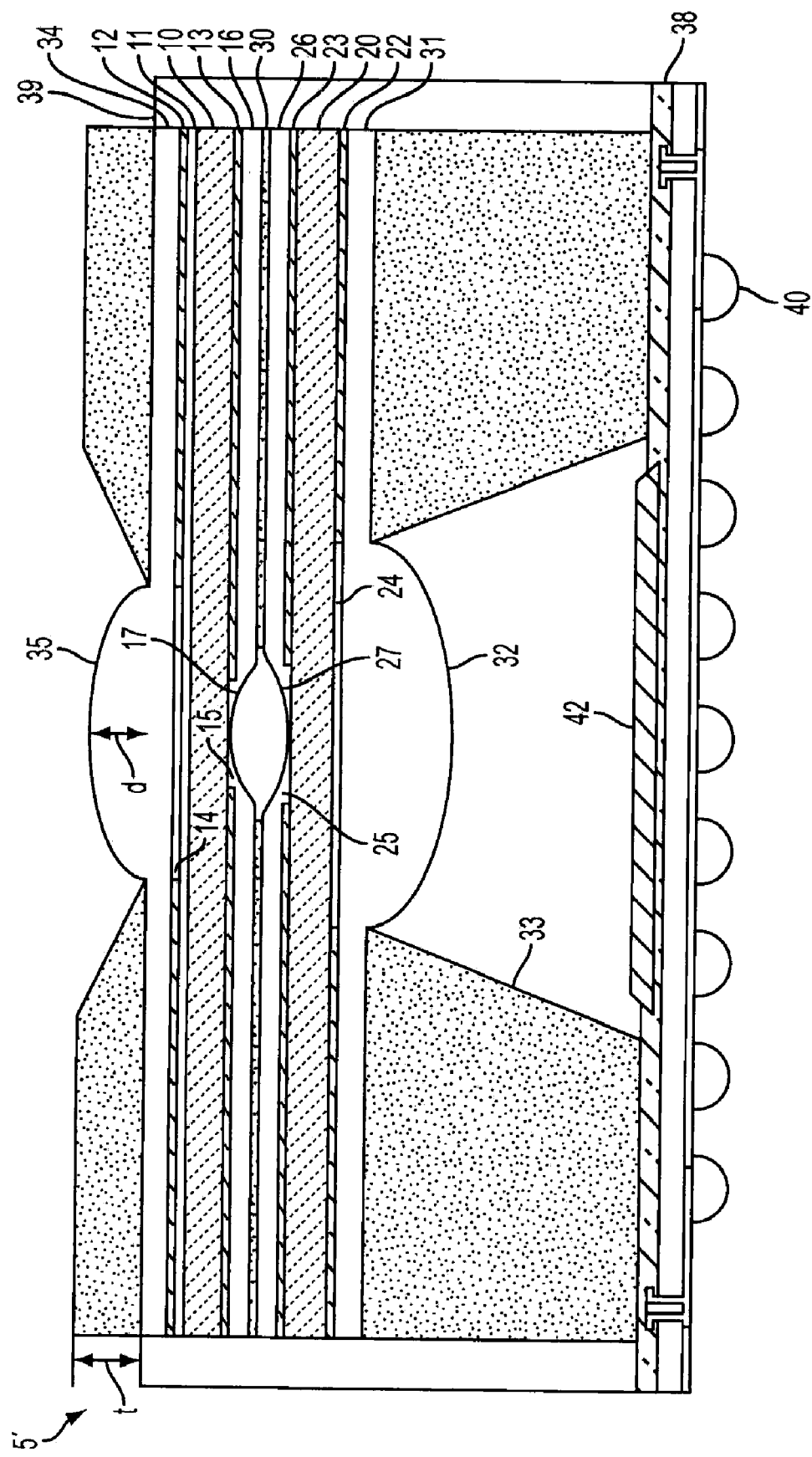
FIG. 2C is a cross-sectional view of an imaging module described herein.

In an alternative embodiment, a lens hood 6 can be added as shown in FIG. 2C. Preferably, the lens hood 6 has a thickness t and outer positive lens 35 has a depth d such that t>d.

Figure 3E:
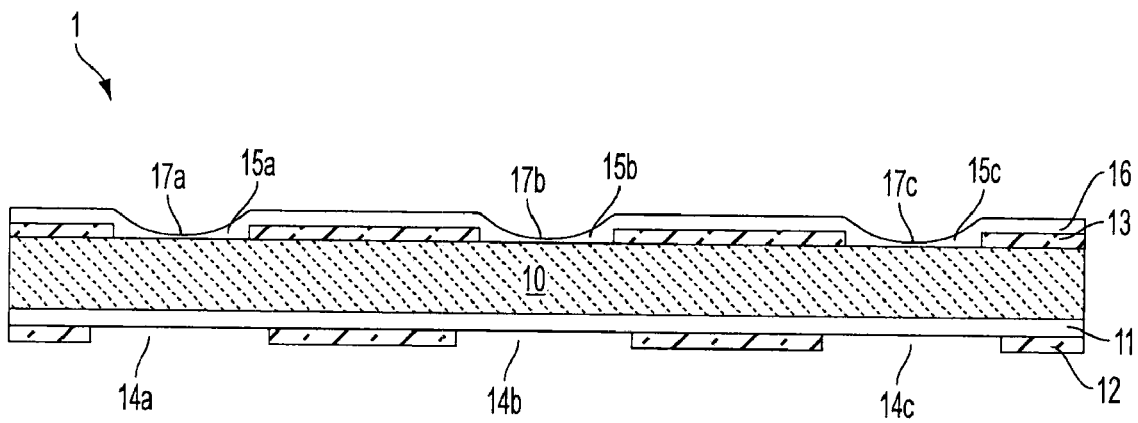
FIG. 3E is a cross-sectional view at a stage of processing subsequent to that shown in FIG. 3D.

FIGS. 3A-15 show one example of a method of manufacturing the imaging module shown in FIGS. 2A-2B. FIGS. 3A-3F show the preparation of a top lens wafer 1. Referring to FIG. 3A, the first step is to provide/produce a transparent substrate 10 by any available method. The transparent substrate 10 may comprise a float glass. One example of a float glass that may be used is a boro-float glass preferably with a coefficient of thermal expansion between 2 and 5 such as Borofloat® 33 from Schott North America, Inc.

Referring to FIG. 3B, an infrared cut filter 11 is deposited on top of the transparent substrate 10 by any available method. While infrared cut filter 11 is deposited on the top of the transparent substrate 10 in the present embodiment, it is to be understood that the infrared cut filter 11 can be deposited on any side of any substrate or lens. In FIG. 3C, light absorbing material 12, 13 is deposited on the top and bottom surfaces, respectively, of transparent substrate 10 by any available method. Light absorbing material 12, 13 can be a black matrix polymer, such as PSK™ 2000, JSR 812, black chromium, or dark silicon, or another appropriate light absorbing material.

Referring to FIG. 3D, portions of light absorbing material 12, 13 are patterned and removed by any available method to provide a plurality of apertures 14a, 14b, 14c, 15a, 15b, 15c.

Referring to FIG. 3E, the top wafer 1 is flipped and a lens replication material 16 is dispensed on the bottom side of the wafer 1 over light absorbing material 13. Lenses 17a, 17b, 17c are then imprinted over the apertures 15a, 15b, 15c using a stamp submaster. The lens replication material 16 may be a low dispersion (Abbe number >50) UV-curable hybrid polymer that requires curing while the lenses 17a, 17b, 17c are imprinted. One example of such a UV-curable hybrid polymer is Ormocomp from Micro Resist Technology.

Figure 3F:
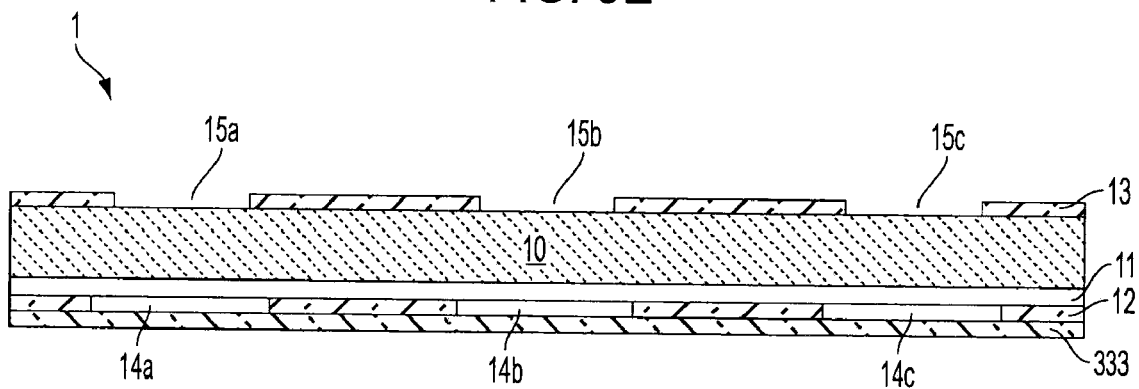
FIG. 3F is a cross-sectional view at an alternate stage of processing subsequent to that shown in FIG. 3D.

Referring now to FIG. 3F, in an alternative embodiment a temporary carrier 333 may be bonded to the wafer 1 for increased strength prior to lens replication, and debonded after lens replication. After debonding, the wafer 1 would be cleaned by any available method.

Figure 4A:
FIG. 4A is a cross-sectional view depicting a transparent substrate for an imaging module at an initial stage of processing.

FIGS. 4A-4E show the preparation of the bottom lens wafer 2. Referring to FIG. 4A, the first step is to provide/produce another transparent substrate 20 by any available method. The transparent substrate 20 may comprise a float glass. One example of a float glass that may be used is a boro-float glass preferably with a coefficient of thermal expansion between 2 and 5 such as Borofloat® 33 from Schott North America, Inc.

Figure 4B:
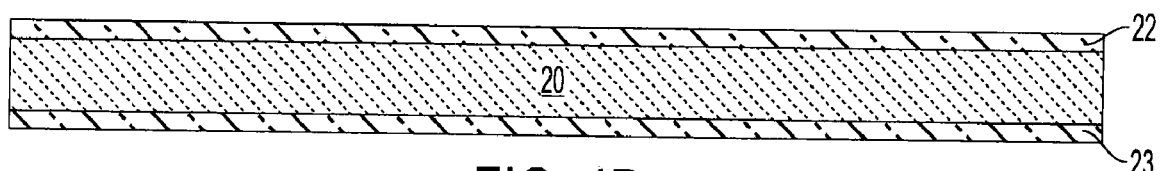
FIG. 4B is a cross-sectional view at a stage of processing subsequent to that shown in FIG. 4A.

Referring to FIG. 4B, light absorbing material 22, 23 is deposited on the top and bottom surfaces, respectively, of transparent substrate 20 by any available method. Light absorbing material 22, 23 can be a black matrix polymer, such as PSK™ 2000, JSR 812, black chromium, or dark silicon, or another appropriate light absorbing material.

Figure 4C:
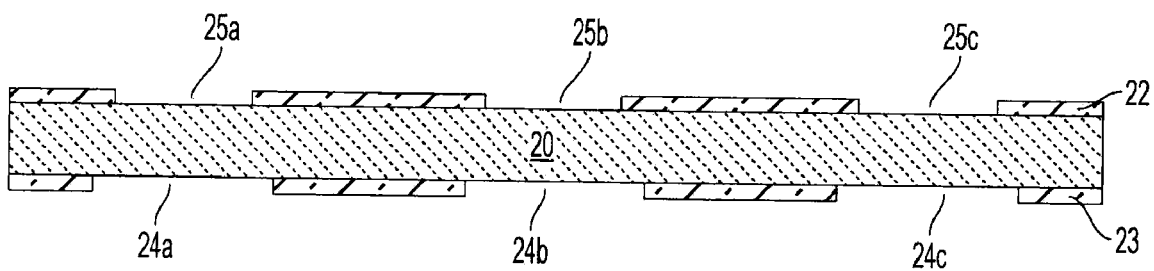
FIG. 4C is a cross-sectional view at a stage of processing subsequent to that shown in FIG. 4B.

Referring to FIG. 4C, portions of light absorbing material 22, 23 are patterned and removed to form a plurality of apertures 24a, 24b, 24c, 25a, 25b, 25c. Apertures 24a, 24b, 24c, 25a, 25b, 25c in the light absorbing material 22, 23 work as field apertures by suppressing false light and allowing for artificial vignetting.

Figure 4D:
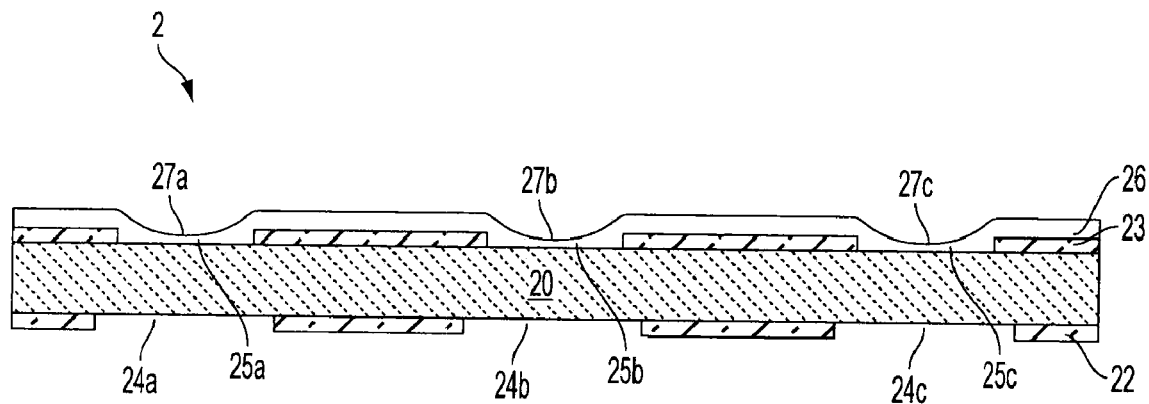
FIG. 4D is a cross-sectional view at a stage of processing subsequent to that shown in FIG. 4C.

Referring to FIG. 4D, a lens replication material 26 is dispensed on the top side of the wafer 2 over light absorbing material 23. Lenses 27a, 27b, 27c are then imprinted over the apertures 25a, 25b, 25c using a stamp submaster. The lens replication material 26 may be a UV-curable hybrid polymer that requires curing while the lenses 27a, 27b, 27c are imprinted. One example of such a UV-curable hybrid polymer is Ormocomp from Micro Resist Technology.

Figure 4E:
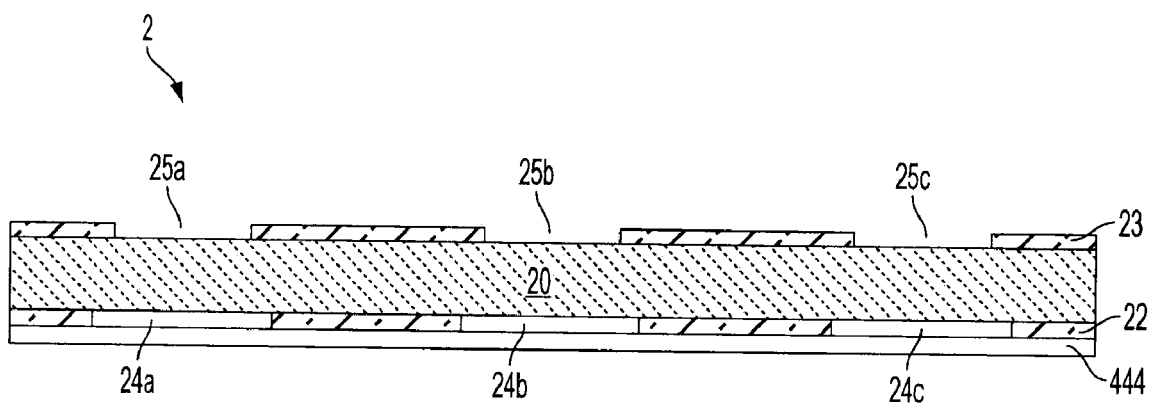
FIG. 4E is a cross-sectional view at an alternate stage of processing subsequent to that shown in FIG. 4C.

Referring now to FIG. 4E, in an alternative embodiment a temporary carrier 444 may be bonded to the wafer 2 for increased strength prior to lens replication, and debonded after lens replication. After debonding, the wafer 2 would be cleaned by any available method.

Figure 5A:
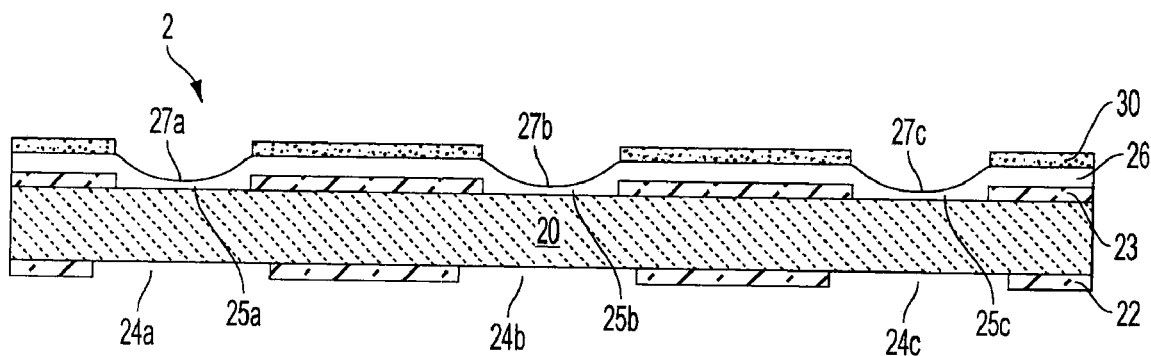
FIG. 5A is a cross-sectional view at a stage of processing subsequent to that shown in FIG. 4D.
Figure 5B:
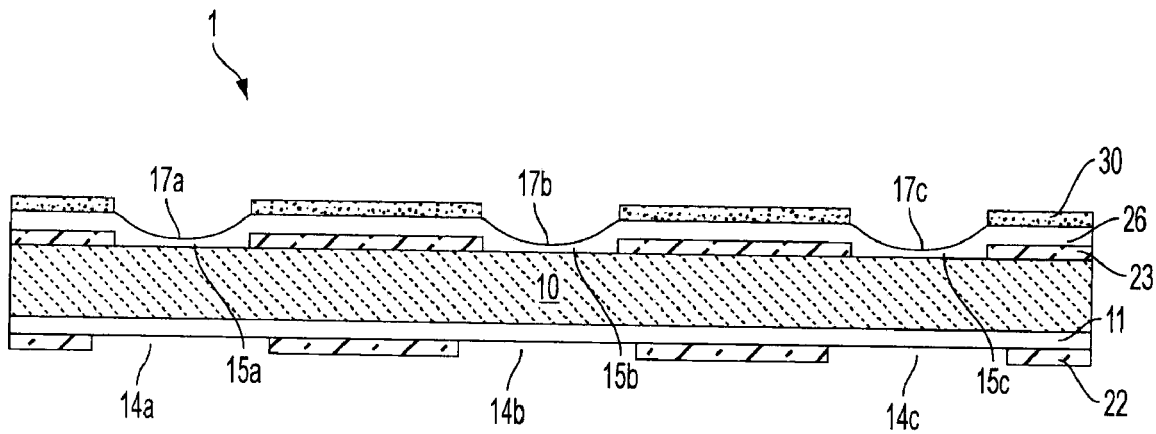
FIG. 5B is a cross-sectional view at a stage of processing subsequent to that shown in FIG. 3E.

The next step is to apply an adhesive material to at least one of the top wafer 1 and bottom wafer 2 to bond the top and bottom wafers 1, 2 together. FIG. 5A shows the adhesive material 30 being applied to the bottom wafer 2 while FIG. 5B shows the adhesive material 30 being applied to the top wafer 1.

Referring to FIG. 5A, an adhesive material 30 is applied to the bottom wafer 2 on the lens replication material layer 26. Referring to FIG. 5B, an adhesive material 30 is applied to the bottom wafer 1 on the lens replication material layer 16. While the adhesive material 30 need only be applied to either the top wafer 1 or bottom wafer 2, adhesive material 30 can be applied to both wafers 1, 2. The adhesive material 30 may be a bonding epoxy and is applied by, for example, screen print, pad print or roller transfer.

Figure 6:
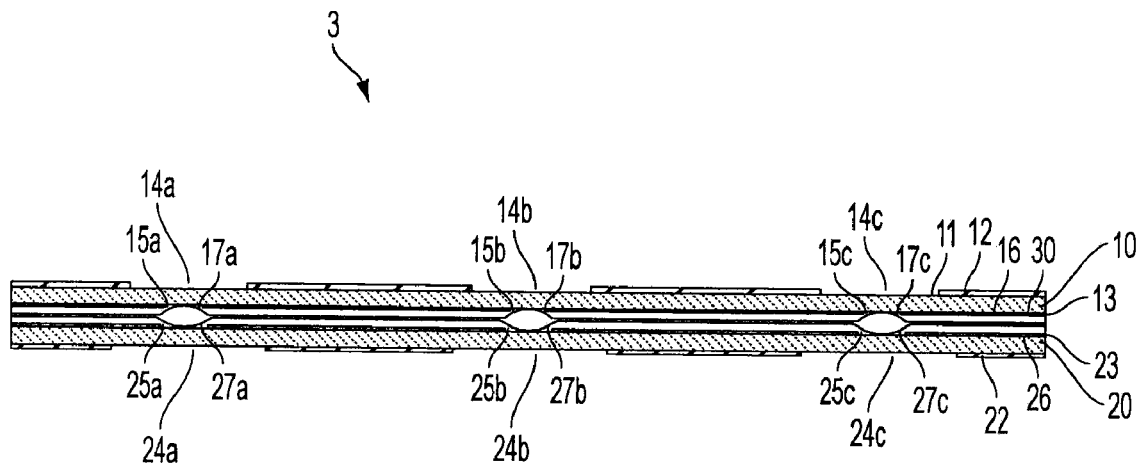
FIG. 6 is a cross-sectional view at a stage of processing subsequent to that shown in FIG. 5A or 5B.

Referring to FIG. 6, top wafer 1 and bottom wafer 2 are attached to create a bonded stack 3 such that the apertures 14a, 15a, 24a, 25a are optically aligned, apertures 14b, 15b, 24b, 25b are optically aligned, apertures 14c, 15c, 24c, 25c are optically aligned, lenses 17a, 27a are optically aligned, lenses 17b, 27b are optically aligned and lenses 17c, 27c, are optically aligned. The surfaces of the wafers 1, 2 with the lens replication material 16, 26 are separated only by the adhesive material layer 30. When the adhesive material 30 is bonding epoxy, the bonding epoxy is cured after the top and bottom wafers are attached.

Figure 6A:
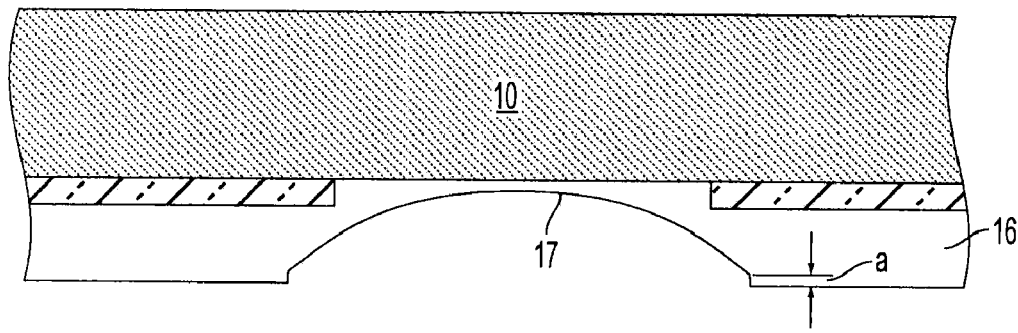
FIG. 6A is a cross-sectional view of an optional stage of processing subsequent to that shown in FIG. 3D.
Figure 6B:
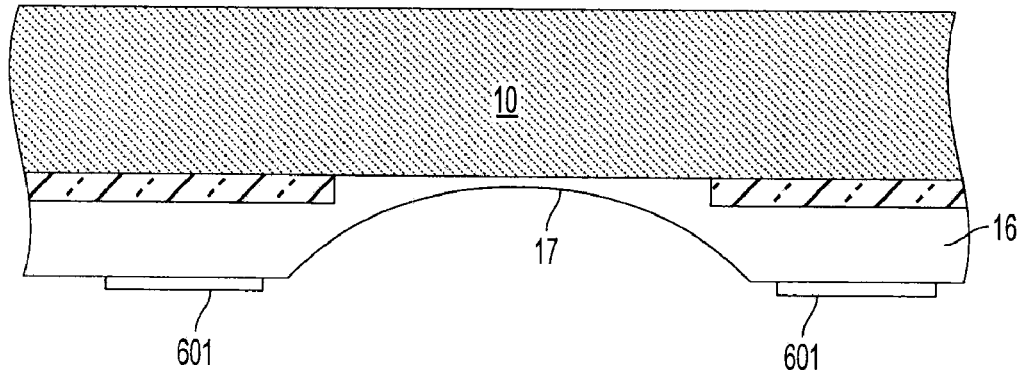
FIG. 6B is a cross-sectional view of an optional stage of processing subsequent to that shown in FIG. 3D.

Lenses 17a, 17b, 17c, 27a, 27b, 27c can be imprinted into lens replication layers 16, 26 to a desired depth or spacers can be added to achieve a desired air gap between the lenses and the wafers 1, 2 to prevent them from touching. As an example, FIG. 6A shows lens replication layer 16 imprinted with lens 17 having added depth a. Also as an example, FIG. 6B shows lens replication layer 16 imprinted with lens 17 and also imprinted with spacers 601.

Figure 7:
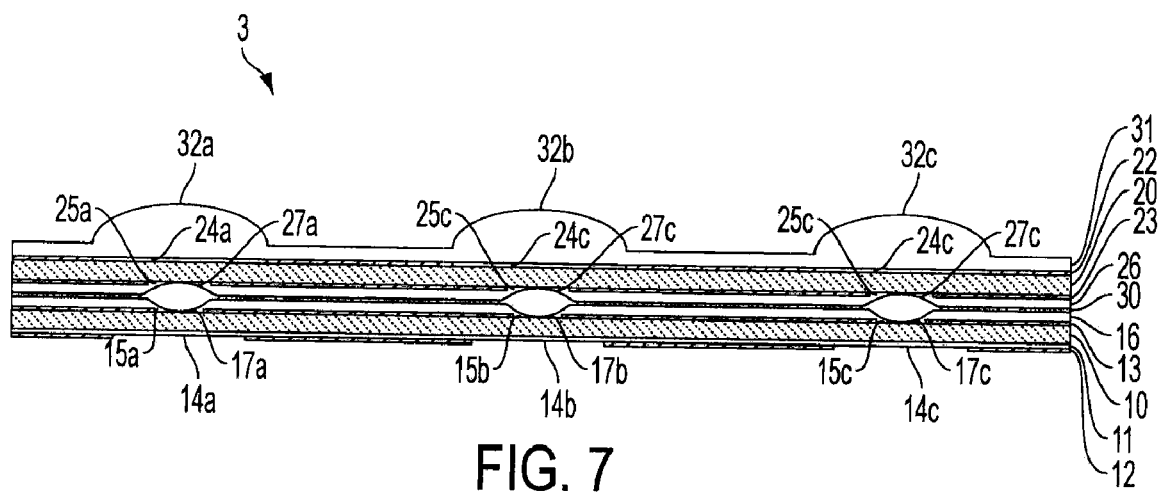
FIG. 7 is a cross-sectional view at a stage of processing subsequent to that shown in FIG. 6.

Referring to FIG. 7, the bonded stack 3 is flipped and a lens replication material 31 is dispensed on the bottom side of the bonded stack 3 by any available method. Lenses 32a, 32b, 32c are imprinted over the apertures 24a, 24b, 24c using a stamp submaster. The lens replication material 26 may be a low dispersion (Abbe number >50) UV-curable hybrid polymer that requires curing while the lenses 32a, 32b, 32c are imprinted. One example of such a UV-curable hybrid polymer is Ormocomp from Micro Resist Technology. It is to be understood that in lenses 32a, 32b, 32c may be imprinted concurrently with lenses 27a, 27b, 27c.

Figure 8:
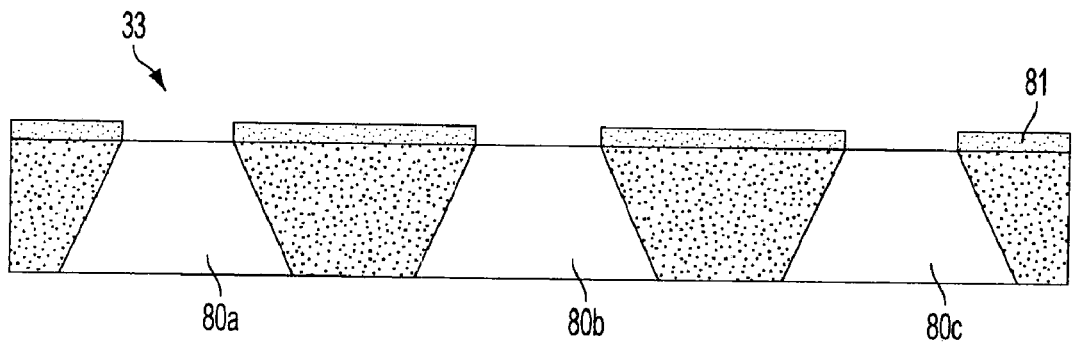
FIG. 8 is a cross-sectional view depicting a spacer wafer at an initial stage of processing.
Figure 9:
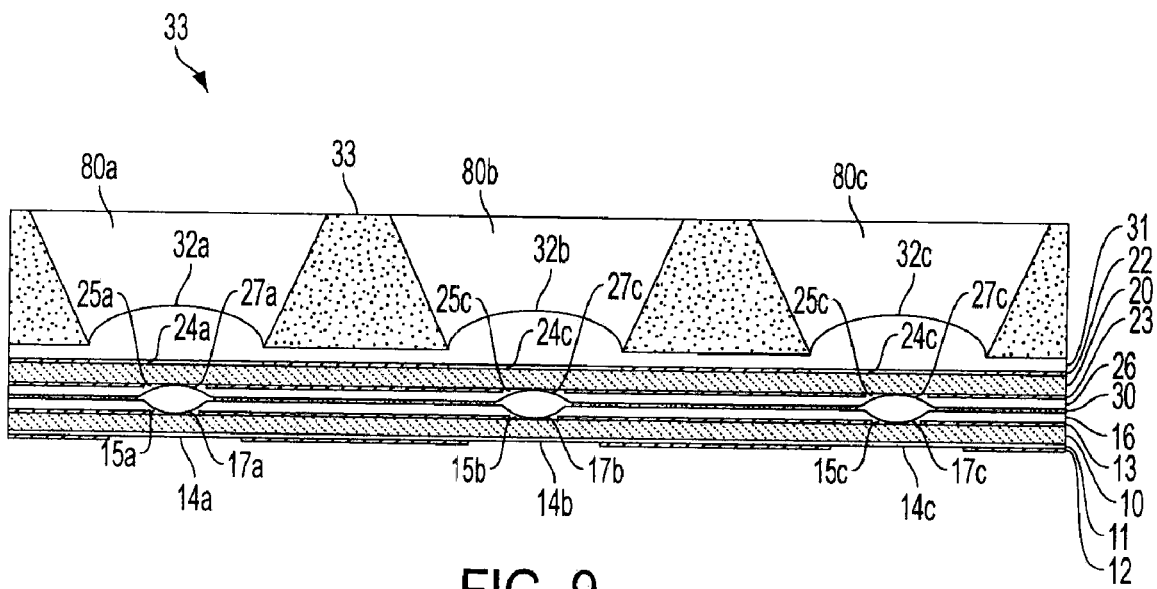
FIG. 9 is a cross-sectional view at a stage of processing subsequent to that shown in FIG. 7.

FIGS. 8 and 9 show the steps for bonding a spacer wafer 33 to the bonded stack 3. FIG. 8 shows spacer wafer 33 and an adhesive material 81 applied to one side of the spacer wafer 33. The adhesive material 81 may be a bonding epoxy and is applied by, for example, screen print, pad print or roller transfer.

Referring now to FIG. 9, the spacer wafer 33 is inverted and placed on the inverted bonded stack 3 such that the lenses 32a, 32b, 32c are optically aligned with pre-fabricated openings 80a, 80b, 80c in the spacer wafer 33. When the adhesive material 81 is bonding epoxy, the bonding epoxy is cured after the spacer wafer 33 and bonded stack 3 are attached.

Referring now to FIG. 10, the bonded stack 3 is again inverted and a lens replication material 34 is dispensed on the top of bonded stack 3 covering light absorbing layer 12 and apertures 14a, 14b, 14c. Lenses 35a, 35b, 35c are imprinted over the apertures 14a, 14b, 14c using a stamp submaster. The lens replication material 34 may be a low dispersion (Abbe number >50) UV-curable hybrid polymer that requires curing while the lenses 35a, 35b, 35c are imprinted. One example of such a UV-curable hybrid polymer is Ormocomp from Micro Resist Technology. It is to be understood that in lenses 35a, 35b, 35c may be imprinted concurrently with lenses 17a, 17b, 17c.

Figure 12:
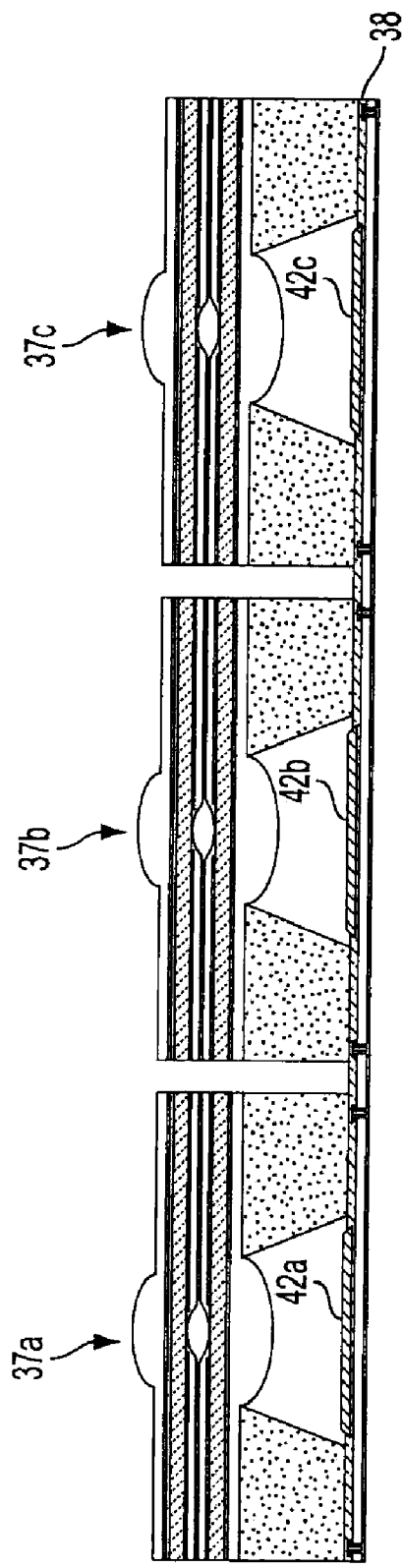
FIG. 12 is a cross-sectional view at a stage of processing subsequent to that shown in FIG. 11.

Referring now to FIG. 11, the bonded stack 3 is diced along lines 36a and 36b. Referring to FIG. 12, after dicing, individual lens stacks 37a, 37b, 37c are bonded to a through-wafer interconnect (TWI) wafer 38 that has fabricated image sensors 42a, 42b, 42c attached thereon. In an alternative embodiment, bonded stack 3 is not diced as in FIG. 11 and the undiced bonded stack 3 is bonded to the through-wafer interconnect (TWI) wafer 38. The bonded stack 3 and through-wafer interconnect (TWI) wafer 38 are then diced to create a plurality of imaging modules 5 according to FIGS. 2A, 2B.

Figure 13:
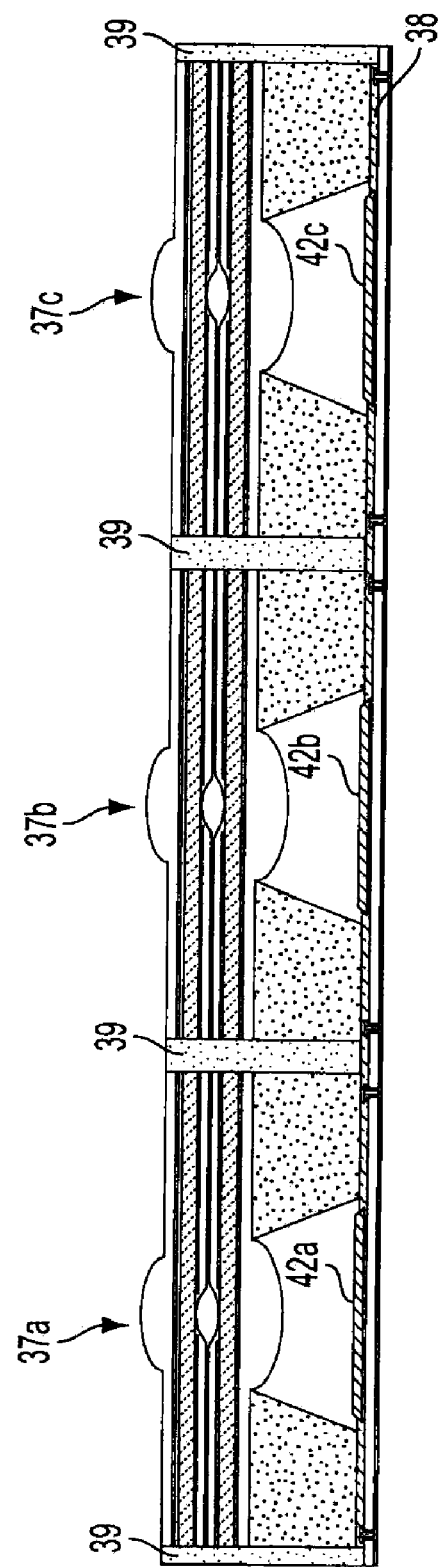
FIG. 13 is a cross-sectional view at a stage of processing subsequent to that shown in FIG. 12.
Figure 14:
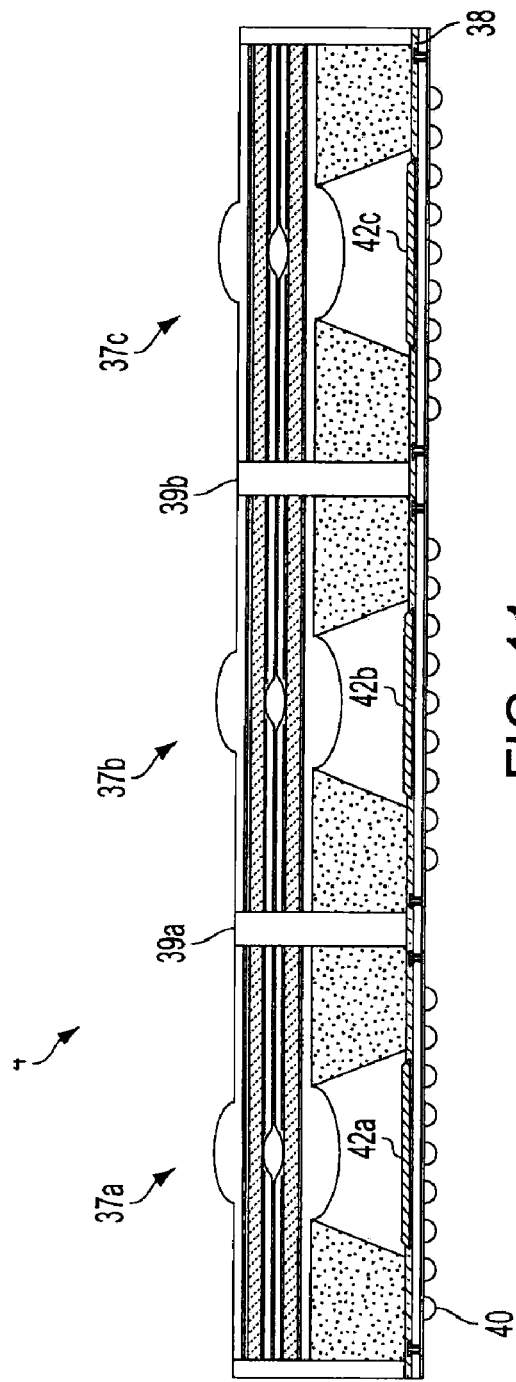
FIG. 14 is a cross-sectional view at a stage of processing subsequent to that shown in FIG. 13.
Figure 15:
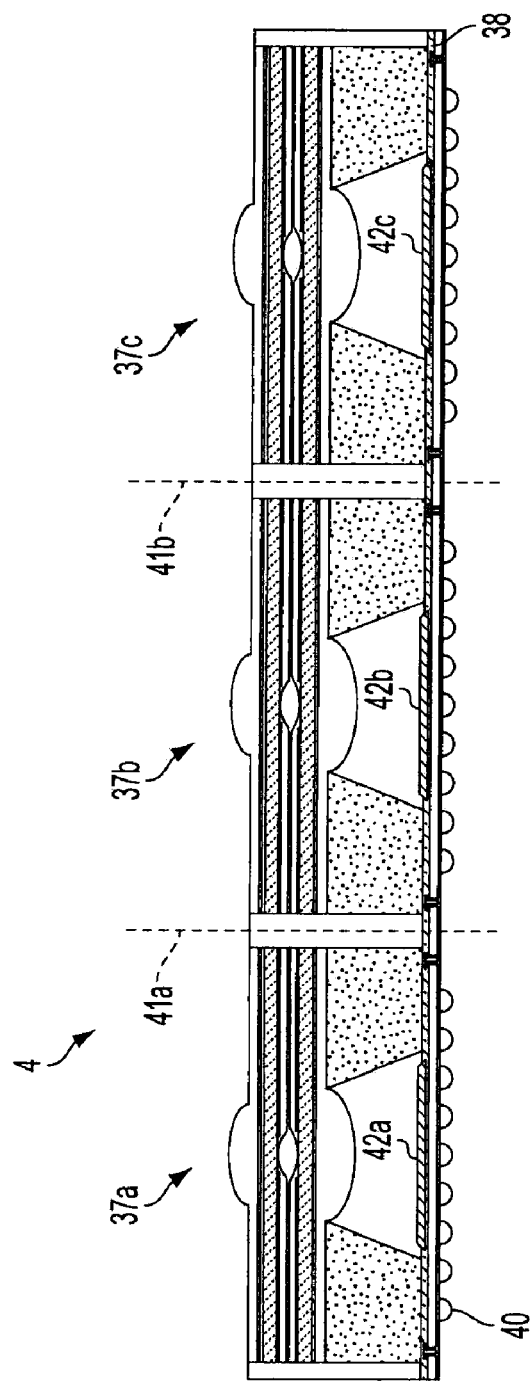
FIG. 15 is a cross-sectional view at a stage of processing subsequent to that shown in FIG. 14.

Referring now to FIG. 13, the lens stacks 37a, 37b, 37c are encapsulated with an encapsulating material 39 by any available technique, separating each lens stack from an adjacent lens stack. Referring now to FIG. 14, solder bumps 40 are added to the through-wafer interconnect (TWI) wafer 38 by any available technique, which connect through through-vias on the through-wafer interconnect (TWI) wafer 38 to conductors on the image sensor 42, forming a completed wafer stack 4. Referring now to FIG. 15, the completed wafer stack 4 is diced along lines 41a and 41b. The result of the dicing is a plurality of imaging modules 5 according to FIGS. 2A, 2B.

FIGS. 16-20 show another example method of manufacturing the imaging module 5 shown in FIGS. 2A, 2B and module 5' in FIG. 2C.

FIG. 16 shows a spacer wafer 33 with an adhesive material 160 disposed on one side of the spacer wafer 33 in the process of being attached to a bottom lens wafer 2. The bottom lens wafer 2 is created according to the steps shown in FIGS. 4A-4E with lenses 32a, 32b, 32c being added according to the lens replication step in FIG. 7. The bottom lens wafer 2 is placed on top of the spacer wafer 33 such that the lenses 32a, 32b, 32c are optically aligned with pre-fabricated openings 80a, 80b, 80c in the spacer wafer 33. The adhesive material 160 may be a bonding epoxy and is cured after the spacer wafer 33 and bottom lens wafer 2 are connected. FIG. 17 shows the result of the FIG. 16 processing, i.e., the bottom lens wafer 2 being attached to the spacer wafer 33.

Figure 18:
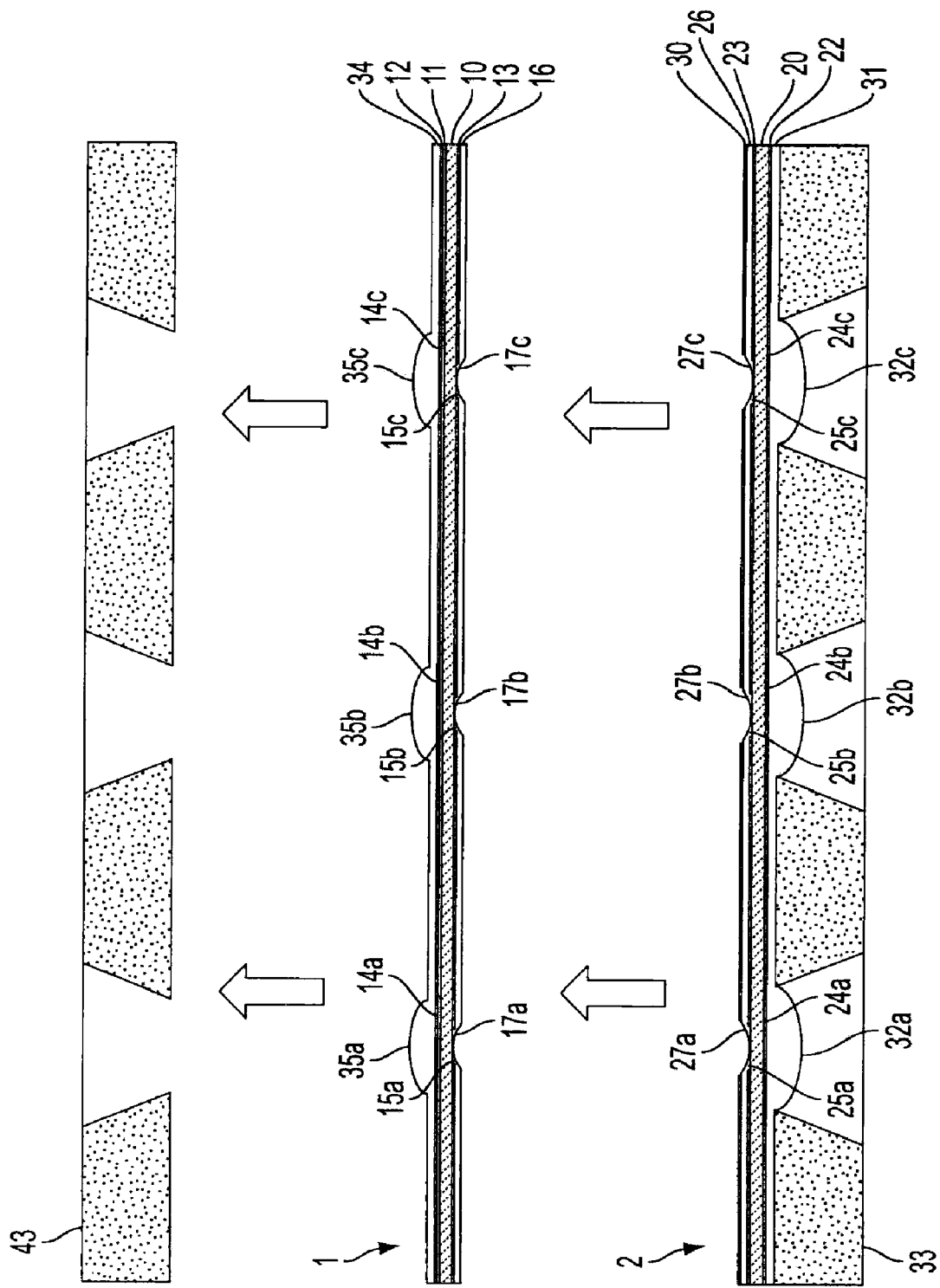
FIG. 18 is a cross-sectional view at a stage of processing subsequent to that shown in FIG. 17.

The next step illustrated in FIG. 18 is a triple-stack method of creating a bonded stack 3. First, top lens wafer 1, constructed according to the steps shown in FIGS. 3A-3F with lenses 35a, 35b, 35c added according to the lens replication step in FIG. 10, is aligned with a second spacer wafer 43. Top lens wafer 1 is then fixed to the second spacer wafer 43 in a manner that is non-bonding. Adhesive material 30, which may be a bonding epoxy, is then applied to the top of bottom lens wafer 2. At this point, top lens wafer 1 and bottom lens wafer 2 are attached to create bonded stack 3 such that the apertures 14, 15, 24, 25 are optically aligned, the lenses 35, 17, 27, 32 are aligned and the surfaces of the wafers with the lens replication material layers 16, 26 are separated only by the adhesive material layer 30. When the adhesive material 30 is bonding epoxy, the bonding epoxy is cured after the bonded stack is assembled.

Figure 19:
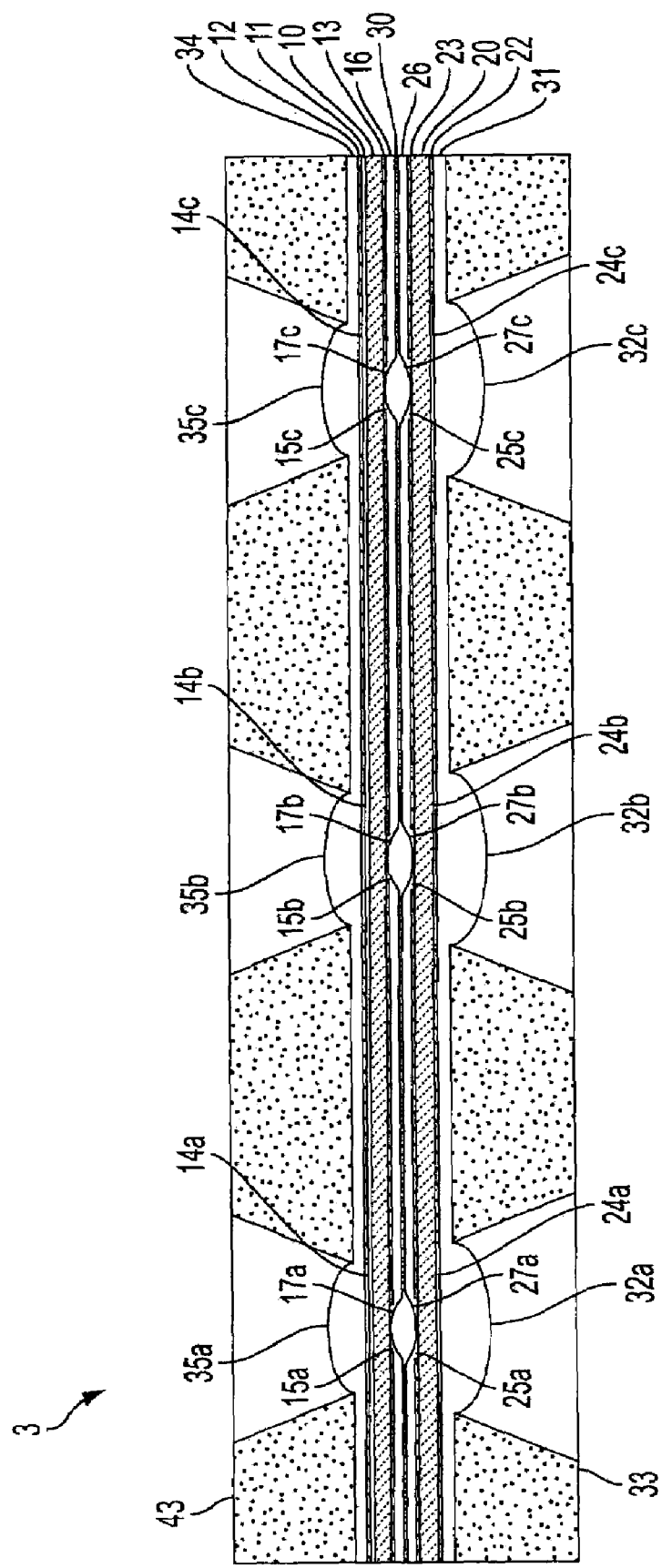
FIG. 19 is a cross-sectional view at a stage of processing subsequent to that shown in FIG. 18.
Figure 20:
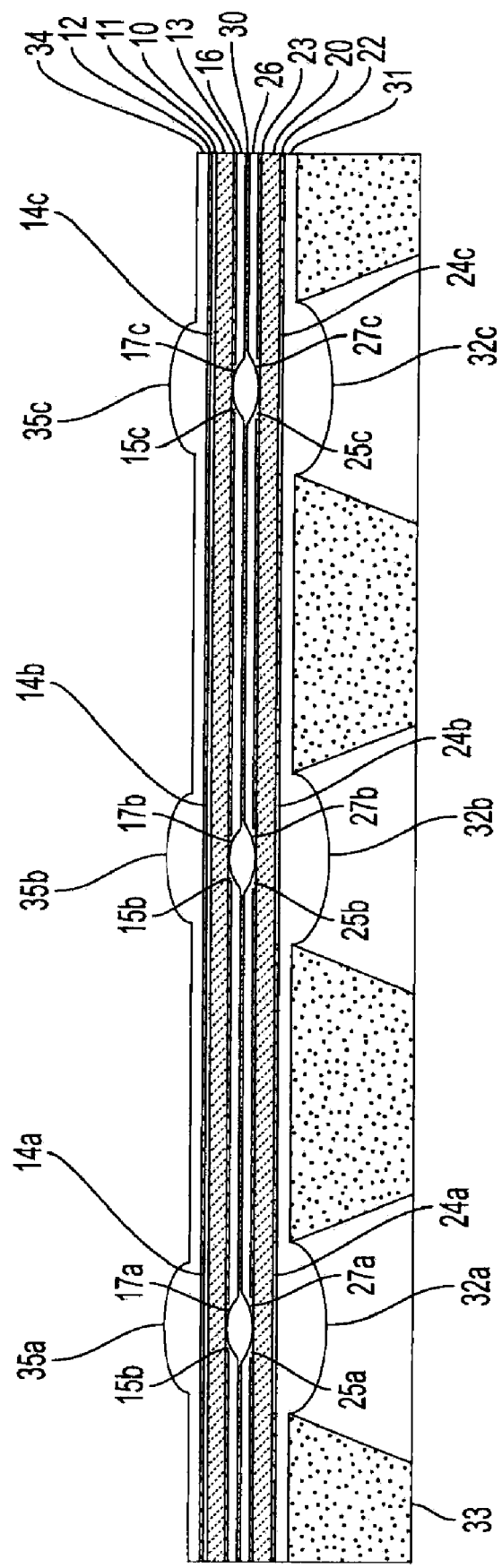
FIG. 20 is a cross-sectional view at a stage of processing subsequent to that shown in FIG. 19.

FIG. 19 shows the bonded stack 3 created by the triple-stack method of FIGS. 16-18. Referring now to FIG. 20, spacer wafer 43 is removed from the top of the bonded stack 3 to reveal a completed bonded stack 3. In an alternative embodiment, spacer wafer 43 includes lens hoods 6 as shown in FIG. 2C and is not discarded. The completed bonded stack 3 shown in FIG. 20 is the same as the completed bonded stack 3 shown in FIG. 10 and, therefore, can be transformed into individual imaging modules 5 shown in FIGS. 2A-2B according to the steps shown in FIGS. 11-15.

In short, an inexpensive and efficient form of manufacturing an imaging module 5, 5' is achieved by manufacturing multiple imaging modules 5, 5' in each bonded wafer stack 3 according to the methods described in FIGS. 3A-20. Furthermore, imprinting lenses 17, 27, 32, 35, e.g., lenses with 6th order aspheric coefficients, into polymer layers 16, 26, 31, 34 creates an imaging module that is smaller and less susceptible to aberrations than other imaging modules.

Figure 21:
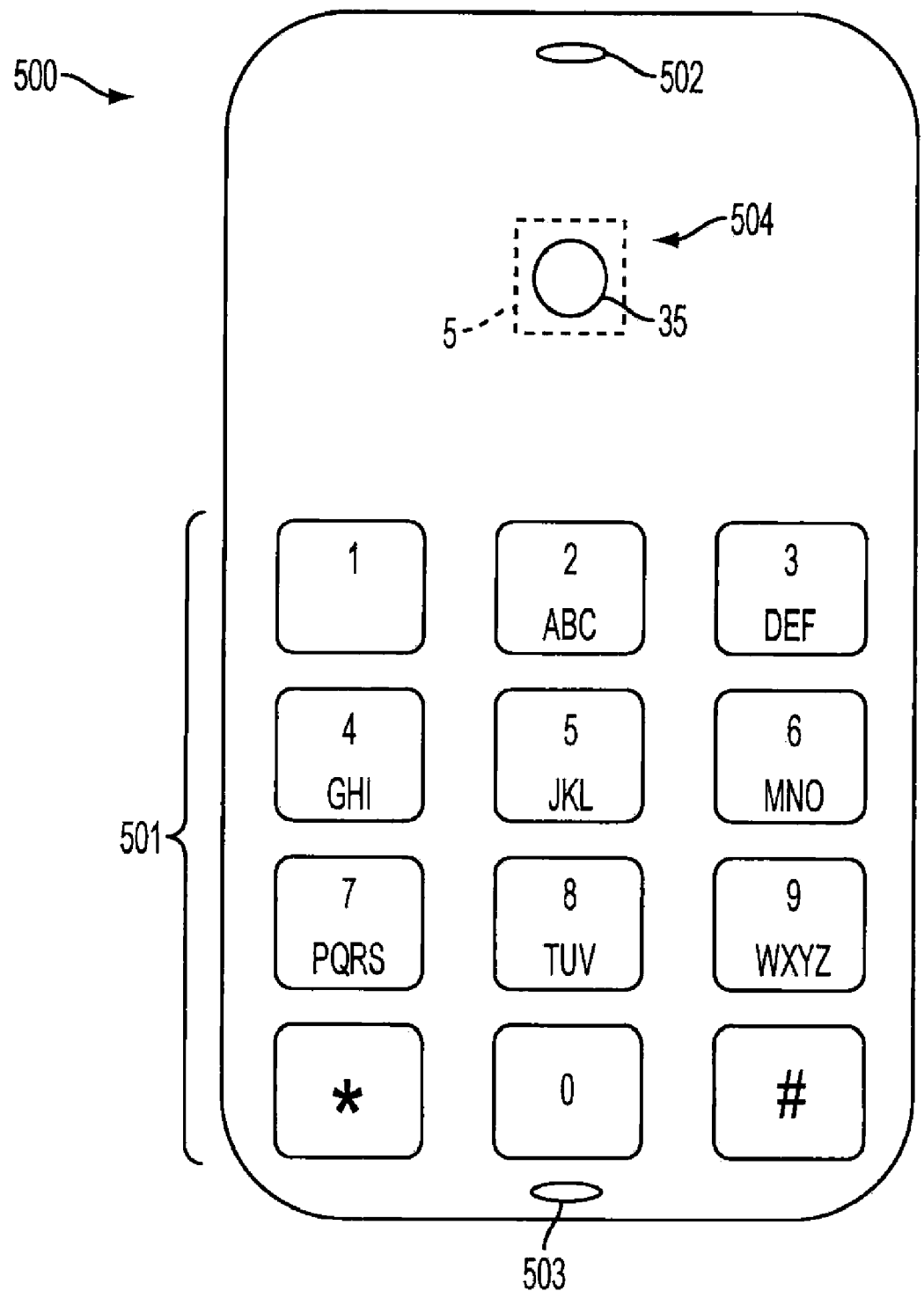
FIG. 21 is a wireless telephone comprising an imaging module according to an embodiment described herein.

FIG. 21 shows a wireless telephone 500 with keypad 501, ear piece 502 and microphone 503. The telephone 500, which can be a cellular telephone, also includes a digital camera 504 that comprises an imaging module 5 according to FIGS. 2A-2B. Outer positive lens 35 may be exposed or may be shielded by a flat transparent cover. The elements of the telephone 500 enumerated herein are included for illustrative purposes only, and wireless telephones covered by this invention include all wireless telephones with more or less features than those included in FIG. 21.

What is claimed as new and desired to be protected by Letters Patent of the United States is:

1. An imaging module comprising:
    a first transparent substrate having a first aperture layer on a first side and a second aperture layer on a second side, the first aperture layer comprising a first aperture and the second aperture layer comprising a second aperture such that the first aperture and the second aperture are optically aligned;
    a first lens replication layer comprising a first positive lens on a first side of the first transparent substrate, the first aperture layer being between the first lens replication layer and the first side of the first transparent substrate and the first positive lens being optically aligned with the first aperture;
    a second lens replication layer comprising a first negative lens on a second side of the first transparent substrate, the second aperture layer being between a first side of the second lens replication layer and the second side of the first transparent substrate and the first negative lens being optically aligned with the second aperture;
    a second transparent substrate having a third aperture layer on a first side and a fourth aperture layer on a second side, the third aperture layer comprising a third aperture and the fourth aperture layer comprising a fourth aperture such that the third aperture and the fourth aperture are optically aligned;
    a third lens replication layer comprising a second negative lens on a first side of the second transparent substrate, the third aperture layer being between a first side of the third lens replication layer and the first side of the second transparent substrate and the second negative lens being optically aligned with the third aperture;
    a fourth lens replication layer comprising a second positive lens on a second side of the second transparent substrate, the fourth aperture layer being between the fourth lens replication layer and the second side of the second transparent substrate and the second positive lens being optically aligned with the fourth aperture; and
    an image sensor comprising a pixel array optically aligned with said lenses and apertures,
    wherein a second side of the second lens replication layer is attached to a second side of the third lens replication layer such that the first, second, third and fourth apertures are optically aligned.

2. The imaging module of claim 1, further comprising an encapsulating material on each side of the imaging module.

3. The imaging module of claim 2, further comprising a spacer between the fourth lens replication layer and the through-wafer interconnect substrate layer.

4. The imaging module of claim 2, further comprising solder balls connected to the image sensor through the through-wafer interconnect substrate layer.

5. The imaging module of claim 1, further comprising a through-wafer interconnect substrate holding the image sensor.

6. The imaging module of claim 1, wherein the lens replication layers comprise an ultraviolet-curable hybrid polymer.

7. The imaging module of claim 1, wherein the aperture layers comprise a light-absorbing material.

8. The imaging module of claim 1, further comprising a lens hood affixed to an image receiving side of the imaging module.

9. The imaging module of claim 1, wherein the first and second transparent substrates comprise a boro-float glass.

10. The imaging module of claim 9, wherein the boro-float glass has a coefficient of thermal expansion between 2 and 5.

11. The imaging module of claim 1, further comprising an infrared cut filter.

12. The imaging module of claim 1, wherein the second aperture is a system stop and the first, third and fourth apertures are field stops.

13. The imaging module of claim 1, wherein at least one of the first positive lens, first negative lens, second negative lens and second positive lens have 6th order aspheric coefficients.

14. The imaging module of claim 1, wherein at least one of the first positive lens, first negative lens, second negative lens and second positive lens has an Abbe number greater than 50.

15. The imaging module of claim 1, wherein at least one of the first positive lens and second positive lens have an Abbe number greater than 50 and the first negative lens and second negative lens have an Abbe number less than 50.

* * * * *

UNITED STATES PATENT AND TRADEMARK OFFICE
CERTIFICATE OF CORRECTION

| | | |
|---|---|---|
| PATENT NO. | : 7,710,667 B2 | |
| APPLICATION NO. | : 12/146306 | |
| DATED | : May 4, 2010 | |
| INVENTOR(S) | : Oliver et al. | |

It is certified that error appears in the above-identified patent and that said Letters Patent is hereby corrected as shown below:

Title page, item [57], Line 1-4

"The method comprises forming a first lens wafer with a plurality of outer negative lenses and forming a second lens wafer with a plurality of inner negative lenses" should read --The method comprises forming a first lens wafer with a plurality of outer negative lenses and forming a second lens wafer with a plurality of inner negative lenses.--

In the drawings, Figures 7, 9, 20, should be replaced with the corrected Figures 7, 9, and 20 as shown below Figure 7, lens $27c$ and apertures $24c$ and $25c$ over which lens $32b$ is imprinted should read, respectively, --$27b$, $24b$, $25b$--

Figure 9, lens $27c$ and apertures $24c$ and $25c$ over which lens $32b$ is imprinted should read, respectively, --$27b$, $24b$, $25b$--

Figure 20, the top left-most aperture "$15b$" should read --$15a$--

Figure 1B:
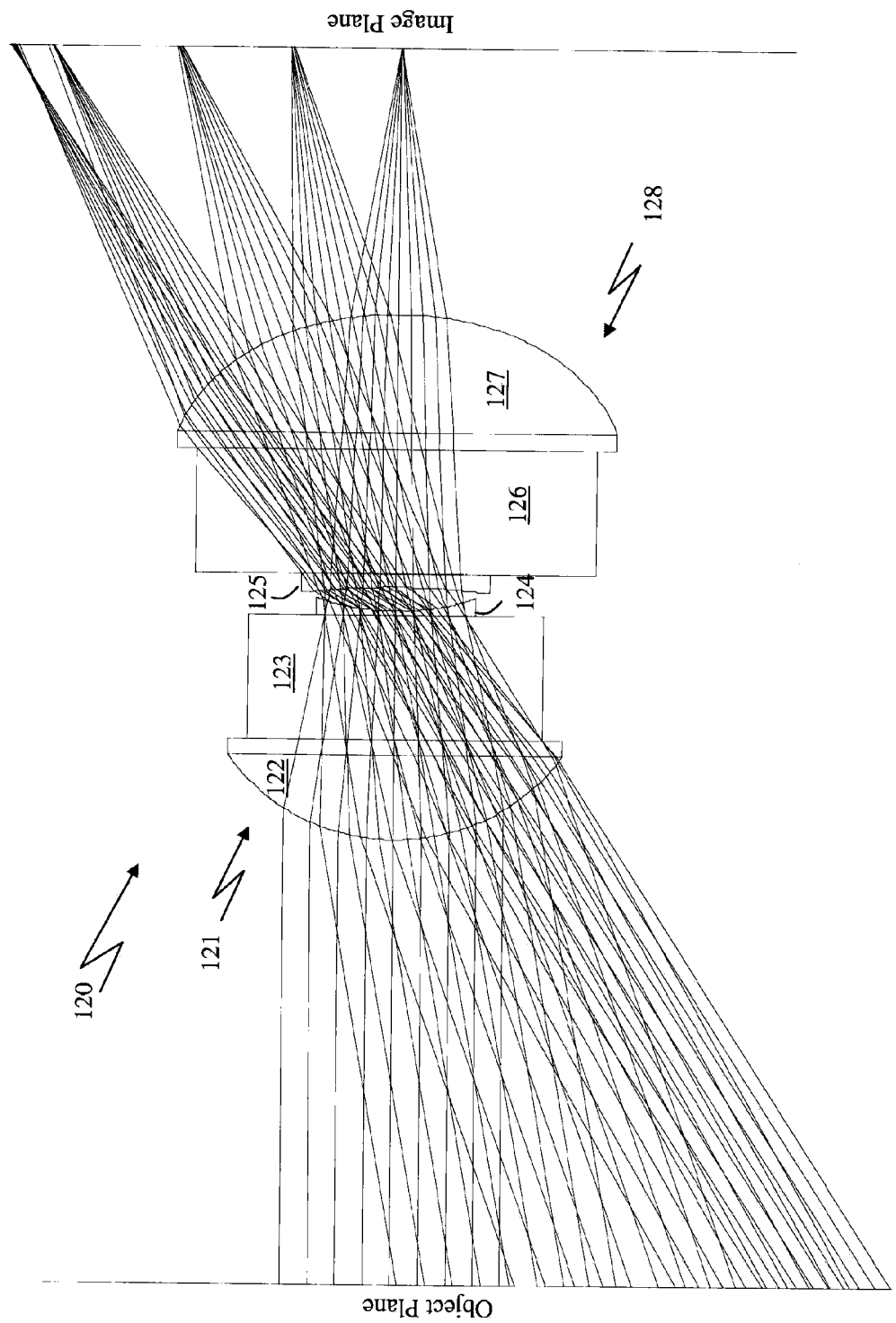
FIG. 1B is a cross-sectional view of a lens system.

Column 1, line 33, "FIG. 1 shows an example of a packaged lens system" should read --FIG. 1A shows an example of a packaged lens system--

Column 1, line 43, "and fixes the lenses in the position shown in FIG. 1" should read --and fixes the lenses in the position shown in FIG. 1A--

Column 4, lines 21-22, "In an alternative embodiment, a lens hood 6 can be added as shown in FIG. 2C. Preferably, the lens hood 6 has a thickness" should read --In an alternative embodiment, a lens hood can be added as shown in FIG. 2C. Preferably, the lens hood has a thickness--

Signed and Sealed this
First Day of May, 2012

David J. Kappos
*Director of the United States Patent and Trademark Office*

CERTIFICATE OF CORRECTION (continued)
U.S. Pat. No. 7,710,667 B2

Column 6, lines 4-6, "It is to be understood that in lenses 32*a*, 32*b*, 32*c* may be imprinted concurrently with lenses 27*a*, 27*b*, 27*c*" should read --It is to be understood that lenses 32*a*, 32*b*, 32*c* may be imprinted concurrently with lenses 27*a*, 27*b*, 27*c*--

Column 6, lines 28-30, "It is to be understood that in lenses 35*a*, 35*b*, 35*c* may be imprinted concurrently with lenses 17*a*, 17*b*, 17*c*" should read --It is to be understood that lenses 35*a*, 35*b*, 35*c* may be imprinted concurrently with lenses 17*a*, 17*b*, 17*c*--